United States Patent

[11] 3,603,848

[72] Inventors Tai Sato
Kohoku-ku, Yokohama-shi;
Yoshiyuki Takeishi, Mitaka-shi, Tokyo;
Yoshihiko Okamoto, Yokohama-shi;
Hisashi Hara, Kamakura-shi, Kanagawa-ken, all of, Japan
[21] Appl. No. 14,174
[22] Filed Feb. 25, 1970
[45] Patented Sept. 7, 1971
[73] Assignee Tokyo Shibaura Electric Co., Ltd.
Kawasaki-shi, Japan
[32] Priority Feb. 27, 1969
[33] Japan
[31] 44/14217

[54] COMPLEMENTARY FIELD-EFFECT-TYPE SEMICONDUCTOR DEVICE
7 Claims, 17 Drawing Figs.

[52] U.S. Cl. .......... 317/235, 317/234, 29/576
[51] Int. Cl. .......... H01l 11/14
[50] Field of Search .......... 317/234, 235, 237–241

[56] References Cited
UNITED STATES PATENTS

| | | | |
|---|---|---|---|
| 2,858,246 | 10/1958 | Pearson | 148/33 |
| 2,858,730 | 11/1958 | Hanson | 317/234 X |
| 3,377,182 | 4/1968 | Bernuth | 317/234 X |
| 3,430,109 | 2/1969 | Li | 317/234 |
| 3,447,902 | 6/1969 | Benedict et al. | 317/234 X |
| 3,457,473 | 7/1969 | Okada et al | 317/234 |

*Primary Examiner*—James D. Kallam
*Attorney*—Flynn & Frishauf

ABSTRACT: A complementary field-effect-type semiconductor device comprising a unitary substrate of the diamond-type crystalline structure or a compound semiconductor of the zinc-blende-type crystalline structure and at least one pair of field-effect transistors having respective N and P channels lying along the main surface of the substrate and oriented in such a manner that the direction of current through one conductivity-type channel or channels is at right angles to the direction of current through the opposite conductivity-type channel or channels. The main surface and the channels are respectively selected to a special crystal face and a crystal axis.

COMPLEMENTARY FIELD-EFFECT-TYPE SEMICONDUCTOR DEVICE

This invention relates to semiconductor integrated circuits, and more particularly to semiconductor devices of the complementary field-effect type having different conductivity-type field-effect transistors.

Complementary field-effect-type semiconductor devices having either metal insulator semiconductor field-effect transistors (MIS-FET) each including a channel or active area along a semiconductor substrate surface contiguous to an insulating film disposed on the substrate, the transistors being spaced a predetermined distance from each other, or PN junction field-effect transistors (PN junction FET), in which the current flow of the active area is controlled by the depletion layer generated in the neighborhood of a PN junction and which are also spaced a predetermined distance, are well known in the art. As a typical example of such device in practical use, there is an inverter circuit having an N-channel MIS-FET and a P-channel MIS-FET. The circuit of this type is required to have an excellent response characteristic (response time) of the output signal in accordance with the input signal, that is, short rise and fall times of the output voltage. The requirement is, however, not satisfied in an aspect of crystallography related to the semiconductor substrate.

This invention is based upon the facts that in the inverter circuit using P- and N- channel field-effect transistors the rise time of the output voltage is shorter, with the higher conductance of the P-channel FET, which is proportional to the mobility of holes, while the fall time of the output voltage is shorter, with the higher conductance of the N-channel FET, which is proportional to the mobility of electrons. Accordingly, the response time may be reduced by increasing the mobility of holes and electrons. The mobility is found to be increased by selecting the active area or channel of the FET to lie in a crystal plane conforming to prescribed conditions and selecting the directions of current of electrons and holes to be respectively parallel or normal to a predetermined crystal axis.

An object of this invention is to provide a complementary field-effect-type semiconductor device comprising a substrate made of a semiconductor selected from the group consisting of semiconductors of diamond-type structure and compound semiconductors of zinc-blende-type structure, and at least one first and second transistors formed in the substrate, the transistors respectively including first and second active areas through which electron and holes currents flow respectively, lying in a specific crystal plane, wherein upon the crystal face in said crystal plane being substantially in a [01$\bar{1}$] plane with an angle $\theta$ being defined by the normal direction of said specific crystal face and a [011] axis ranges from 0° to 35°15′, the directions of flow of said electron and hole currents are respectively perpendicular and parallel to said [01$\bar{1}$] axis, and with said angle $\theta$ ranging from 35°16′ to less than 90°, the directions of flow of said electron and hole currents are respectively parallel and perpendicular to the [01$\bar{1}$] axis, and upon the crystal face being substantially in a [100] plane with an angle $\theta$ being defined by the normal direction of the crystal face and a [011] axis ranging from 0° to less than 45°, the directions of flow of said electron and hole currents are respectively parallel and perpendicular to said [100] axis.

This invention can be more fully understood from the following detailed description when taken in connection with reference to the accompanying drawings, in which.

The inventors of this invention have found the following crystallographical conditions for the increased carrier mobility for the FET.

Figure 1:
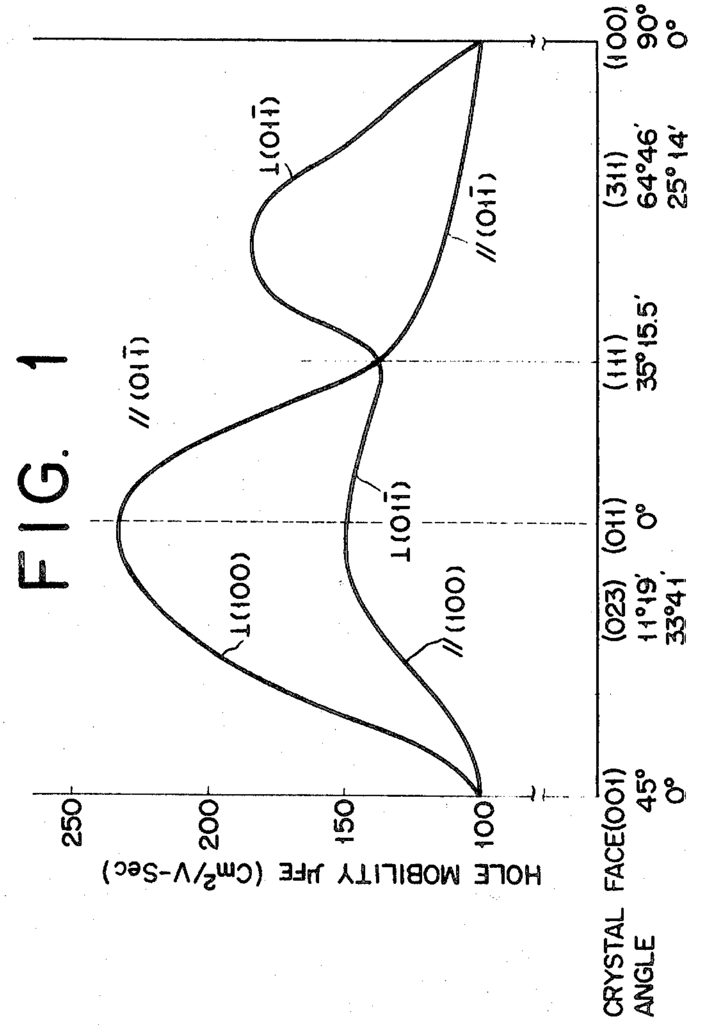
FIG. 1 is a graph showing the relationship between the crystal plane of the active area of a transistor and the mobility of holes flowing through the area.
Figures 2, 7, 9:
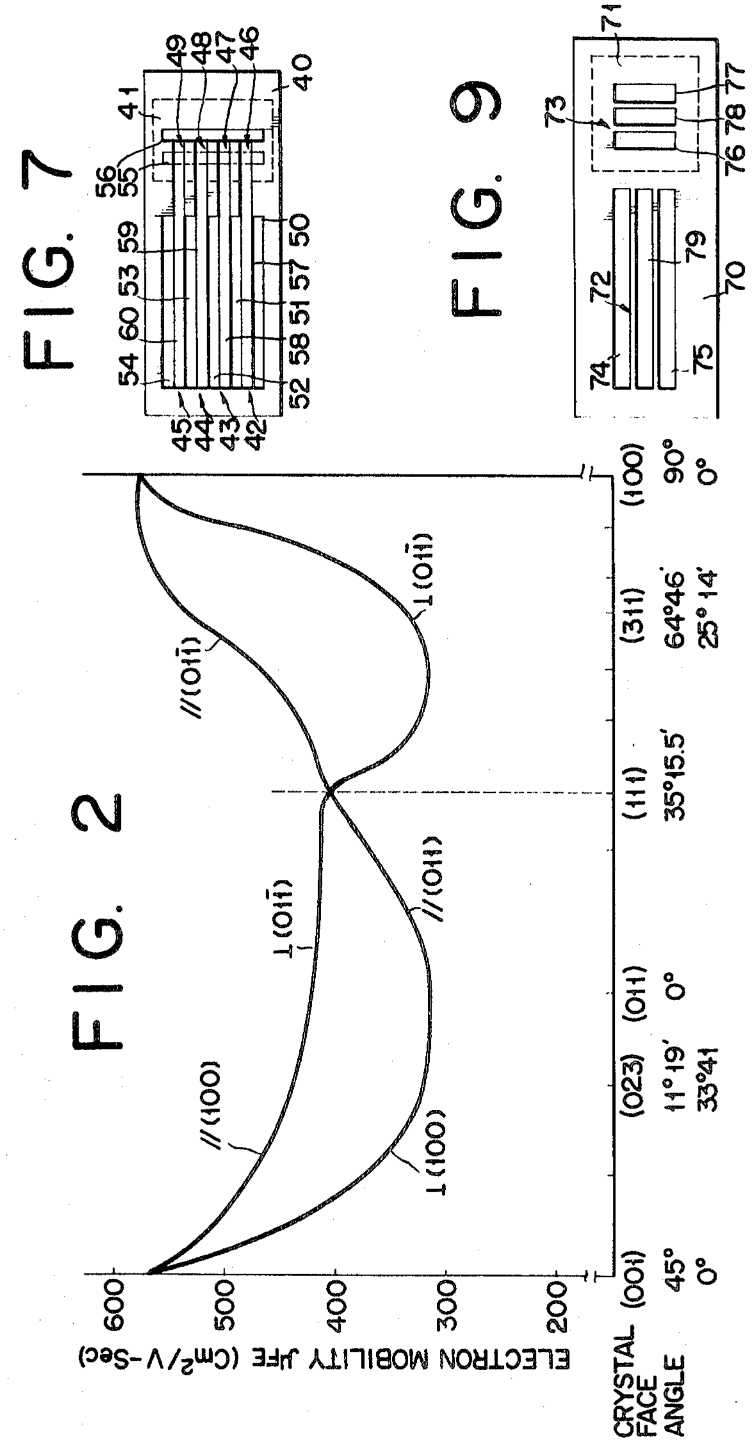
FIG. 2 is a graph showing the relationship between the crystal plane of the active area of a transistor and the mobility of electrons flowing through the area.
FIG. 7 is a schematic plan view of a semiconductor device of a further embodiment according to the invention.
FIG. 9 is a schematic plan view of a semiconductor device of still further embodiment according to the invention.

Measurements of current in the directions parallel and normal to various crystal planes belonging to a [100] zone for the active area of channel of the P-channel and N-channel MIS-FET's comprising a substrate of a semiconductor of the diamond-type crystalline structure or a compound semiconductor of the zinc blende crystalline structure reveal the tendencies of the carrier mobility of these transistors as shown in FIG. 1, which gives plots of the mobility $\mu_P$ of holes, and in FIG. 2, which gives plots of the mobility $\mu_N$ of electrons. The above measurements were made with $V_G$—$_T$= 25 volts, where $V_G$ is the gate voltage and $V_T$ the threshold voltage to cause current flow. As seen from the figure, if a crystal plane belonging to a [100] gone is used for the P channel the mobility is generally higher when current is in the direction normal to a [100] axis (⊥[100]), than in the direction parallel the axis (// [100]), while for the N channel it is generally higher when current is in the//[100 than in the⊥[100]. Accordingly, for the complementary MIS-IC having the N and P channels lying in the same crystal plane, it is readily possible to select the directions of current of holes and electrons in such a manner that their mobilities are maximum by approximately determining the directions of currents so as to improve its performance and response characteristic.

There are roughly similar tendencies of the carrier mobility in the case of a crystal plane belonging to a [01$\bar{1}$] zone, which is selected as the transistor channel. In a case where the angle $\theta$ defined by the normal direction of said particular crystal plane, and a [011] axis is in a range between o° and 35°15′, the mobility of holes for the P channel is higher in the//[01$\bar{1}$] than in the⊥[01$\bar{1}$], while it is higher for the N channel in the⊥[01$\bar{1}$] than in the//[01$\bar{1}$]. On the other hand, in case the above angle $\theta$ is in a range between 35°16′ and 90°, 90° exclusive, for the P channel the mobility is lower in the//[01$\bar{1}$] than in the⊥[01$\bar{1}$], while for the N channel it is lower in the⊥[01$\bar{1}$] than in the// [01$\bar{1}$].

When used in the present invention, the term "[] zone" should be crystallographically construed in a broad sense and covers not only a special [] zone but also other zones equivalent thereto. Similarly, the term "[] axis" covers not only a special [] axis but also other axes equivalent thereto. Furthermore, the axis, zones and the direction of flow of electron and hole currents may be respectively allowed to about ±5° errors thereof.

Generally, the larger the $V_g - V_T$, the smaller the mobility. But the relative relationship between the curves shown in FIGS. 1 and 2 is little affected. In the figure, $V_G$ designates the gate voltage, $V_T$ the threshold voltage of electron current at the initial flow, and //[01$\bar{1}$] and⊥[01$\bar{1}$] respectively the directions of current which are parallel and normal to the [01$\bar{1}$] crystal axis, and//[100] and⊥[100] respectively the directions of current which are parallel and normal to the [100] crystal axis.

The description will now be concerned with the manufacture of a semiconductor device, to which the invention appertains, with reference to FIGS. 3A to 3I.

Figure 3A:
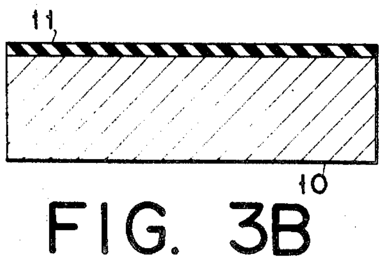
FIGS. 3A to 3I are schematic sectional views, except for FIG. 3I, which is a schematic plan view, illustrating the successive steps of manufacture of a semiconductor device pertaining to the invention.

There is first prepared an N-conductivity-type silicon wafer or substrate 10 having, for instance, a (311) face as the main surface and a resistivity of 5 ohm-cm. The main surface of the substrate is polished to provide a mirror surface, and the broken layer of about 10 microns thick generated on the substrate is removed by chemically etching. Then, the substrate 10 is heated in an oxidization atmosphere containing water vapor to a temperature of about 1,000° C. so as to form an insulator film such as a silicon dioxide, silicon nitride, aluminum oxide, for example, a silicon dioxide film 11 atop the main surface (FIG. 3A).

Figure 3E:
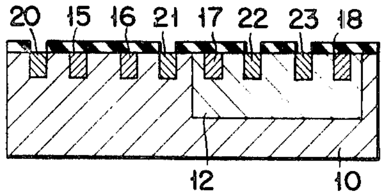
Figure 3B:
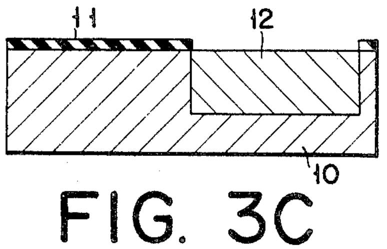

The silicon dioxide film 11 is then partly removed by the photoetching process to expose the corresponding part of the main surface. Boron as the active impurity is diffused from the exposed surface part into the substrate 10 to form a P-conductivity-type region 12 having a surface impurity concentration of about $1 \times 10^{17}$ atoms/cm.$^3$ and a diffusion depth of about 10 microns (FIG. 3B).

The remaining silicon dioxide 11 is then removed by using, for instance, an HF-type etchant, followed by the formation of a new silicon dioxide film 14 about 3,000 A. thick on the top surface of the P-type region 12. The film 14 may be formed in various ways such as by the thermal treatment of the wafer in a dry oxidization atmosphere at a temperature of 1,145° C. to form a first silicon dioxide film about 500 A. thick, followed by deposition of a second silicon dioxide film about 2,500 A. thick on the first film by the thermal decomposition of ethoxysilane at a temperature of 650° C.

Figure 3F:
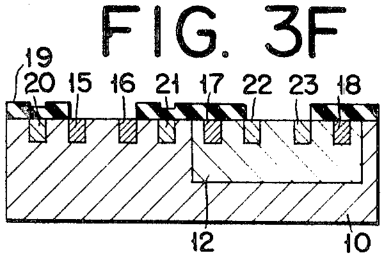
Figure 3C:
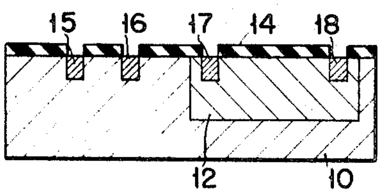

Thereafter, the film 14 is formed with windows or apertures; namely, a pair of apertures spaced a predetermined distance from each other atop the substrate surface and a pair of apertures also spaced a predetermined distance from each other atop the surface of the P-type region by the photoetching technique, and then boron is diffused through these apertures into the wafer to form $P^+$-type conductivity island regions 15 and 16 respectively constituting the source and drain of the eventual P-channel FET in the substrate as well as $P^+$ island regions 17 and 18 constituting the anti-inversion layers of the eventual N-channel FET in the P-type region 12 (FIG. 3C).

The boron diffusion in this step is carried out by using boron bromide ($BBr_3$) as the diffusion source in a blend atmosphere of oxygen and nitrogen at a temperature below 1,050° C., and the resultant island regions 15, 16, 17 and 18 respectively have a surface resistance of about 20 ohms per square and a diffusion depth of about 1.5 microns.

Figure 3G:
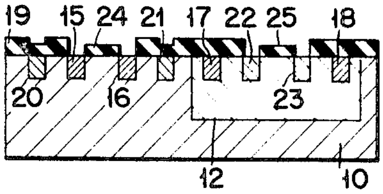
Figure 3D:
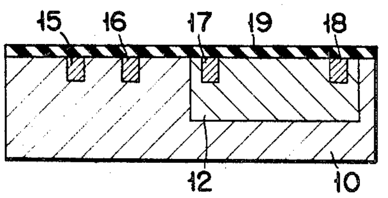

Subsequently, the silicon dioxide film 14 having the apertures is etched off, and the entire area of the exposed main surface of the wafer 10 is covered with a third silicon dioxide film 19 in the same manner as above (FIG. 3D).

Then, the insulating film 19 is partly removed by the photoetching process at predetermined portions, namely, a pair of portions atop the substrate surface and a pair of portions atop the surface of the P-type region. Phosphorus is diffused through the resultant apertures into the wafer 10 to form N-conductivity-type island regions 20 and 21 and $N^+$-conductivity type island regions 22 and 23 respectively in the substrate 10 and in the P-type region 12, the island regions 20 and 21 constituting the respective anti-inversion layers of the eventual P-channel FET and the island regions 22 and 23 respectively constituting the source and drain of the eventual N-channel FET (FIG. 3E).

Afterwards, the semiconductor wafer 10 is treated in an oxidization atmosphere containing water vapor at a temperature of, for instance, about 1,145° C. to cover the surface of the film 19 and the exposed surface of the island regions 20 to 23 with another silicon dioxide film (designated together with the old silicon dioxide film generally by the reference numeral 19 to simplify the description and drawing). Of the resultant silicon dioxide film 19, portions overlying the corresponding part of the substrate 10 proper between the small regions 15 and 16 and the corresponding part of the P-type region 12 between the small regions 22 and 23 are removed by the selective photoetching method (FIG. 3F).

Then, other silicon dioxide films 24 and 25 are selectively formed on the exposed part of the substrate proper between the source and drain regions 15 and 16 and on the exposed part of the P-type region between the source and drain regions 22 and 23 (FIG. 3G). The films 24 and 25 are preferably doped with phosphorus to enhance the stability of the transistor action.

Figure 3H:
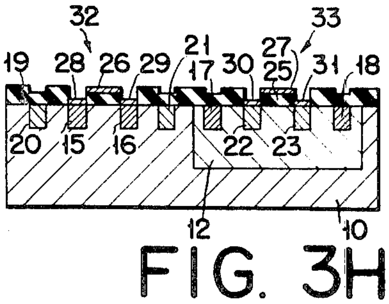
Figure 3I:
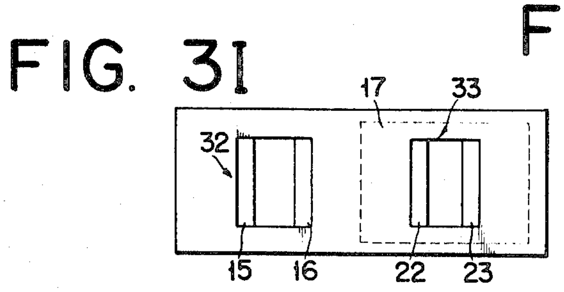

Finally, on the oxide films 24 and 25 and the exposed small regions 15, 16, 22 and 23 are respectively formed gate electrodes 26 and 27, source electrodes 28 and 30 and drain electrodes 29 and 31 to complete a P-channel MOS-FET 32 and an N-channel MOS-FET 33 (FIGS. 3H and 3I). The formation of these electrodes may be achieved by such means as depositing, for instance, aluminum on the oxide films 24 and 25 and on the small regions 15, 16, 22 and 23, followed by removal of the required portions of the deposited aluminum film by the photoetching process.

The method just described for manufacturing the above semiconductor device (hereinafter referred to as the reference semiconductor device) is also applied in the manufacture of the semiconductor device according to the invention. In contrast to the reference semiconductor device, wherein both the P-channel and N-channel MOS-FET's are arranged geometrically parallel to each other, the semiconductor device according to the invention has both these MOS-FET's arranged geometrically perpendicular to each other under predetermined conditions, to be described hereinafter in detail.

Figure 4:
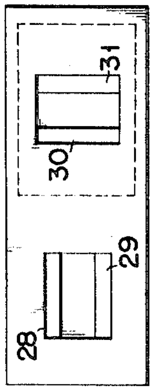
FIG. 4 is a schematic plan view of a semiconductor device of an embodiment according to the invention.

An embodiment of the semiconductor device according to the invention is shown in FIG. 4, where like parts as in the reference semiconductor device are designated by like reference numerals, omitting the detailed description thereof.

The function and response characteristic of the complementary field-effect type semiconductor devices of both the above structural patterns, namely parallel and perpendicular patterns, will now be described in detail.

Measurements of the rise and fall times, i.e., the response characteristic, of these semiconductor devices of both structural patterns have been made in order to study the dependence of the carrier mobility of P and N channels of both these devices upon the crystal plane and crystal axis thereof to obtain the following results:

A. With a crystal plane belonging to the [100] zone, which is selected to be either normal or parallel to the above channels (the main surface of the substrate of the device),
   a. in case the electron current through the N-channel transistor is in the direction normal to the <100> axis (the N channel is normal to the <100> axis), while the hole current through the P-channel transistor is in the direction parallel to the <100> axis (the P channel is parallel to the <100> axis),
   b. in case the electron current through the N-channel transistor is in the direction parallel to the <100> axis, and the hole current through the P-channel transistor is also in the direction parallel to the <100> axis,
   c. in case the electron current through the N-channel transistor is in the direction normal to the <100> axis, and the hole current through the P-channel transistor is also in the direction normal to the <100> axis, and
   d. in case the electron current through the N-channel transistor is in the direction parallel to the <100> axis, while the hole current through the P-channel transistor is in the direction normal to the <100> axis, both the rise and fall times are shortest in case (d). In case (c), the rise time is substantially the same as in case (d), but the fall time is about 1.3 times what is observed in case (d). In case (b), the fall time is substantially the same as in case (d); but the rise time is about 1.5 times what is observed in case (d). In case (a), the rise and fall times are respectively about 1.5 times and about 1.3 times those in case (d).

As is apparent from the above results of the measurements, when the directions of flow of carriers (electrons and holes) in the P-channel and N-channel transistors are selected such as in the case (d), that is, as in the semiconductor device according to the invention, the maximum carrier mobility, and hence the minimum rise and fall times, may be attained to obtain a device suitable for high-speed switching operation.

B. With a crystal plane belonging to the [01$\bar{1}$] zone and defining an angle $\theta$ ranging between 0° and 35°15′ between its normal and the <01$\bar{1}$> axis,
   a. in case the electron current through the N-channel transistor is in the direction normal to the <01$\bar{1}$> axis, while the hole current through the P-channel transistor is in the direction parallel to the <01$\bar{1}$> axis,
   b. in case the electron current through the N-channel transistor is in the direction parallel to the <01$\bar{1}$> axis, and the hole current through the P-channel transistor is also in the direction parallel to the <01$\bar{1}$> axis,
   c. in case the electron current through the N-channel transistor is in the direction normal to the <01$\bar{1}$> axis, and the hole current through the P-channel transistor is also in the direction normal to the <01$\bar{1}$> axis, and
   d. in case the electron current through the N-channel transistor is in the direction parallel to the <01$\bar{1}$> axis, while the hole current through the P-channel transistor is in the direction normal to the <01$\bar{1}$> axis, both the rise and fall times are shortest in case (a). In case (b), the rise time is substantially the same as in case (a), but the fall time is about 1.3 times what is observed in case (a). In case (c), the fall time is substantially the same as in case (a) but the rise time is about 1.5 times what is observed in case (a). In case (d), the rise and fall times are respectively about 1.5 times and about 1.3 times those in case (a).

C. With a crystal plane belonging to the [01$\bar{1}$] zone and defining the above angle $\theta$ ranging between 35°16′ and 90°, excluding 90°,
   a. in case the electron current through the N-channel transistor is in the direction normal to the <01$\bar{1}$> axis, while the hole current through the P-channel transistor is in the direction parallel to the <01$\bar{1}$> axis,
   b. in case the electron current through the N-channel transistor is in the direction parallel to the <01$\bar{1}$> axis, and the hole current through the P-channel transistor is also in the direction parallel to the <01$\bar{1}$> axis,
   c. in case the electron current through the N-channel transistor is in the direction normal to the <01$\bar{1}$> axis, and the hole current through the P-channel transistor is also in the direction normal to the <01$\bar{1}$> axis, and
   d. in case the electron current through the N-channel transistor is in the direction parallel to the <01$\bar{1}$> axis, while the hole current through the P-channel transistor is in the direction normal to the <01$\bar{1}$> axis, both the rise and fall times are shortest in case (d). In case (c), the rise time is substantially the same as in case (d) but the fall times is about 1.3 times what is observed in case (d). In case (b), the fall time is substantially the same as in case (d) but the rise time is about 1.5 times what is observed in case (d). In case (a), the rise and fall times are respectively about 1.5 times and about 1.3 times those in case (d).

Figure 5:
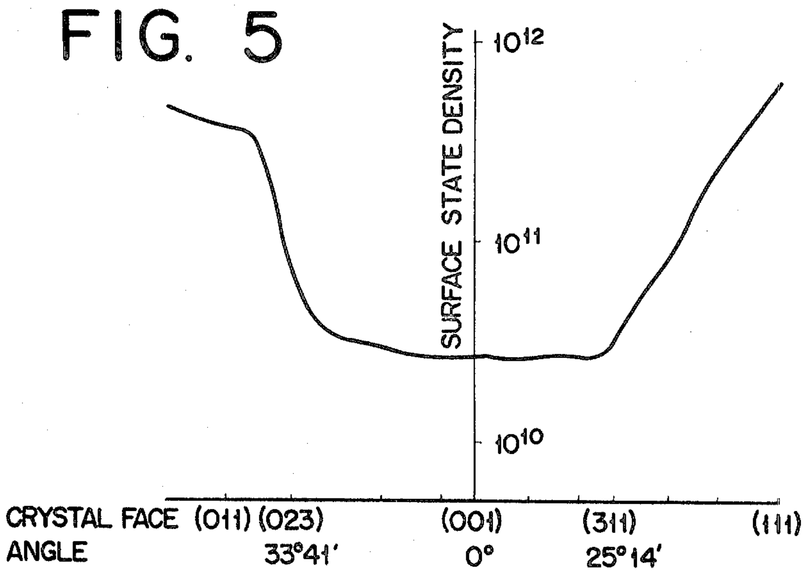
FIG. 5 is a graph showing the relationship between the crystal plane of the active area of the transistor and the surface state density.

In addition to the above dependence of the carrier mobility upon the crystal plane and crystal axis, upon which the invention is based, there is obtained a relation between the aforespecified crystal planes and the surface state density $N_{ss}$, as shown in FIG. 5. The inversion voltage $V_I$ may be minimized by selecting a crystal plane, for which the $N_{ss}$ is minimum. As is apparent from FIG. 5, the $N_{ss}$ is minimum for crystal planes lying at angles within 25°54′ with respect to the (100) face as the reference face toward the (111) face (planes intermediate between the (311) and (111) faces) and within 33°41′ toward the (011) face (planes intermediate between the (100) face and the (023) face).

However, considering also the value of the hole mobility shown in FIG. 1 and that of the electron mobility shown in FIG. 2, the range of angles satisfying said $N_{ss}$, $\mu_P$ and $\mu_N$ at the same time is defined within about 16° from the (311) face toward the (111) face, within about 20° from the (311) face toward the (001) face, within about 26° from the (023) face toward the (011) face and within about 5° from the (023) face toward the (01$\bar{1}$) face. In other words, where the crystal plane lies in the [01$\bar{1}$] zone, the angle $\theta$ is defined within the range of from about 48°46′ to 84°16′, and where the crystal plane falls in the [100] zone, said angle $\theta$ is defined within the range of from about 6° to about 37° 20′.

Where the P and N channels of the complementary MIS-IC are formed in such crystal planes and the current and holes are allowed to move in a prescribed direction, then there is obtained a semiconductor device in which the inversion voltage, as well as the rise and fall times, have a small value. This semiconductor device is adapted for use particularly in a transistor such as an MIS-FET where $N_{ss}$ poses an important problem. An inverter circuit prepared by the present inventors from an MOS-type FET gave good results.

Figure 6:
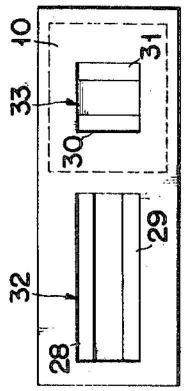
FIG. 6 is a schematic plan view of a semiconductor device of another embodiment according to the invention.

Further, the performance of the semiconductor device, which is improved by crystallographically selecting the orientation of the channels of the P-channel and N-channel transistors in the above manner, may still be improved by suitably arranging the relative dimensions and spacing of both channels as shown in FIG. 6, which illustrates a modification of the semiconductor device of FIG. 4, so that like parts are designated by like reference numerals, omitting the detailed description thereof.

In a semiconductor substrate 10 are arranged a P-channel transistor 32 and an N-channel transistor 33 spaced a predetermined distance from each other so as to be arranged perpendicular to each other to allow the extension of said P channel to intersect said N channel. The direction of current through the P channel of the transistor 32 is at right angles to the direction of current through the N channel of the other transistor 33, that is, the longitudinal direction of the source and drain electrodes 28 and 29 of transistor 32 is at right angles to the longitudinal direction of the electrodes 30 and 31 of transistor 33.

It is to be noted that the length of the P channel of transistor 32 is about three times the length of the N channel of transistor 33. This ratio of the channel lengths substantially equalizes the internal resistances of both transistors, because in this type of transistors the mobility of electrons is usually about three times the mobility of holes. With this construction, the space factor may be bettered to render the semiconductor device more compact so as to enable achieving a higher density of integration of the integrated circuits. Also, as it is possible to arrange the opposite transistors relatively closely, the lead lines between these transistors may be curtailed to reduce the stray capacitance, thereby improving the switching speed.

Figure 8:
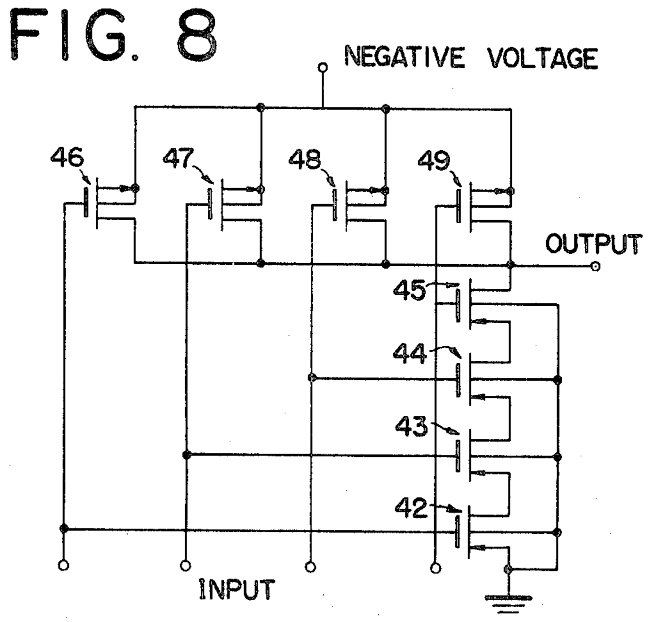
FIG. 8 is a circuit diagram of the semiconductor device of FIG. 7.

The complementary field-effect type semiconductor devices according to the invention are not limited to those having only one pair of MIS-FET's as in the foregoing embodiments, but can include those having a plurality of P-channel and N-channel transistor pairs such as a NAND-circuit-type semiconductor device, as shown in FIGS. 7 and 8.

This device comprises a N-conductivity-type silicon substrate 40 formed with a P-coductivity-type region 41 the the impurity diffusion from the substrate main surface. In the substrate 40 proper there are formed four P-channel MOS-FET's 42 to 45, while in the P-type region 41 there are formed corresponding four N-channel MOS-FET's 46 to 49. These transistors are formed in accordance with the aforedescribed specifications which are featured by the invention. For instance, with the substrate main surface lying in the (023) plane, the crystal axes for their channels are selected such that the directions of current through the N channels and the P channels are respectively parallel and normal to the <100> axis. The P-channel transistors 42 to 45 respectively include source and drain regions 50 and 51, 51 and 52, 52 and 53, and 53 and 54. The N-channel transistors 45 to 48 have common source and drain electrodes 55 and 56. The P-channel transistors 42 to 45 have respective gate electrodes 57 to 60 extending up to the corresponding N-channel transistors 45 to 48 and serving also as the gate electrodes thereof. The transistors in this device are connected in such a manner as shown in FIG. 8 to constitute a NAND circuit. In the operation of this circuit, where a negative voltage source is used and the negative level and zero level of the input and output voltages are respectively termed logic "1" and logic "0," if a negative pulse (logic "1") appears at all of the input terminals, all the P-channel transistors 42 to 45 are triggered to cause a zero-level pulse (logic "0") to appear at the output terminal, while for the other combinations of input signals appearing at the input terminals there appears a negative pulse (logic "1") at the output terminal.

Considering now the switching speed of these types of NAND circuits, the time required for the instant of appearance of an input pulse till the distant of appearance of the corresponding output pulse in switching the output voltage level from the zero level over to the negative level substantially depends upon the internal resistance of the N-channel transistors, and the switching speed is slowed down when one of the four N-channel transistors is triggered. Thus, in the NAND circuit the time required for the output voltage level-shift from zero level to negative level is determined by the internal resistance of one N-channel transistor, and conversely the time required for the level-shift from negative level to zero level is determined by the sum of the internal resistances of all four triggered P-channel transistors, as they are connected in series. In this respect, the NAND circuit according to the invention has an excellent response characteristic as in the previous embodiments, since the channels are crystallographically oriented such that the hole mobility of the P-channel transistors and the electron mobility of the N-channel transistors are high as compared to those of similar prior art devices.

The preceding embodiments of the semiconductor device according to the invention have MIS-FET's. The invention applies also to the device in which current is applied by a field intensity of more than $1 \times 10^4$v./cm., for example, having other type FET's such as PN-junction-type FET, Schottky-gate-type FET.

FIG. 9 shown another embodiment of the semiconductor device according to the invention including Schottky-gate-type FET's. It comprises a P-conductivity-type silicon substrate 70 cut off in such a manner that the main surface lies in the (211) plane and which is formed with an N-conductivity-type region 71. Schottky-type transistors 72 and 73 are respectively formed in the substrate 70 proper and in the N-type region 71. The transistor 72 is a so-called P-channel transistor consisting of P-conductivity-type source and drain regions (not shown) spaced a predetermined distance from each other, on which are respectively formed source and drain electrodes 74 and 75, between which is in turn formed a gate electrode 79 in Schottky barrier contact with the substrate 70. The other transistor is a so-called N-channel transistor consisting of $N^+$-conductivity-type source and drain regions (not shown) spaced a predetermined distance from each other, on which are respectively formed source and drain electrodes 76 and 77, which between is in turn formed a gate electrode 78 in Schottky barrier contact with the N-type region 71. These transistors 72 and 73 have their respective P and N channels respectively normal and parallel to the <01$\bar{1}$> axis.

This complementary field-effect-type semiconductor device has a very excellent response characteristic similar to the preceding embodiments.

For the substrate of the semiconductor device according to the invention may be used silicon semiconductors of the diamond crystalline structure such as germanium, semiconducting diamond, etc., and compound semiconductors of the zinc blende crystalline structure such as gallium arsenide, gallium phosphide, gallium antimonide, etc.

What we claim is:

1. A complementary field-effect-type semiconductor device comprising a substrate made of a semiconductor selected from the group consisting of semiconductors of diamond-type structure and compound semiconductors of zinc-blende-type structure, and at least one first and second transistors formed in the substrate, the transistors respectively including first and second active areas through which electron and hole currents flow respectively, lying in a crystal plane, wherein upon the crystal face in said crystal plane being substantially in a [01$\bar{1}$] plane with an angle $\theta$ being defined by the normal direction of said crystal face and a [011] axis ranging between 0° and 35°15′, the directions of flow of said electron and hole currents are respectively perpendicular and parallel to said [01$\bar{1}$] axis, and with said angle $\theta$ ranging from 35°16′ to less than 90°, the directions of flow of said electron and hole currents are respectively parallel and perpendicular to the [01$\bar{1}$] axis, and upon the crystal face in said crystal plane being substantially in a [100] plane with an angle $\theta$ defined by the direction of the crystal face and a [011] axis ranging from 0° to less than 45°, the directions of flow of said electron and hole currents are respectively parallel and perpendicular to the [100] axis.

2. A complementary field-effect-type semiconductor device comprising a substrate made of one semiconductor selected from the group consisting of a semiconductor of diamond-type structure and a compound semiconductor of zinc-blende-type structure, and at least one first and second transistors formed in the substrate, the transistors respectively including first and second active areas having a crystal face lying in a crystal plane, in which electron and hole currents flow respectively, wherein when said crystal face in said crystal plane is substantially in a [01$\bar{1}$] plane with an angle $\theta$ defined by the normal direction of said crystal face and a [011] axis ranging between 0° and 35°15′, the directions of flow of said electron and hole currents are respectively perpendicular and parallel to said [01$\bar{1}$] axis, and with said angle $\theta$ ranging from 35°16′ to less than 90°, the directions of flow of said electron and hole currents are respectively parallel and perpendicular to the [01$\bar{1}$] axis.

3. A semiconductor device according to claim 2 wherein said angle $\theta$ ranges from 48°46′ to 84°46′.

4. A complementary field-effect-type semiconductor device comprising a substrate made of one semiconductor selected from the group consisting of a semiconductor of diamond-type structure and a compound semiconductor of zinc-blende-type structure, and at least one first and second semiconductor transistors formed in the substrate, the transistors respectively including first and second active areas having a crystal face lying in a crystal plane, in which electron and hole currents flow respectively, wherein when said crystal face in said crystal plane is substantially in a [100] plane with an angle $\theta$ defined by the normal direction of the crystal face and a [011] axis ranging between 0° and less than 45°, the directions of flow of said electron and hole currents are respectively parallel and perpendicular to said [100] axis.

5. A semiconductor device according to claim 4 wherein said angle $\theta$ ranges from 6° to 37°20′.

6. A semiconductor device according to claim 5 wherein said first and second semiconductor transistors are respectively N-channel and P-channel metal insulation semiconductor field-effect transistors, the N channel and P channel of the respective transistors comprising first and second active areas respectively.

7. A semiconductor device according to claim 6 wherein the N channel and P channel of said respective transistors are arranged perpendicular to each other in the substrate to allow the extension of said channel of one transistor to intersect said channel of the other transistor.